United States Patent
Yamazaki

(10) Patent No.: US 9,779,937 B2
(45) Date of Patent: *Oct. 3, 2017

(54) MANUFACTURING METHOD OF SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/972,780

(22) Filed: Dec. 17, 2015

(65) Prior Publication Data

US 2016/0111281 A1    Apr. 21, 2016

Related U.S. Application Data

(63) Continuation of application No. 14/227,304, filed on Mar. 27, 2014, now Pat. No. 9,245,959, which is a
(Continued)

(30) Foreign Application Priority Data

Aug. 25, 2010 (JP) ................. 2010-187878

(51) Int. Cl.
*H01L 21/02* (2006.01)
*H01L 29/49* (2006.01)
(Continued)

(52) U.S. Cl.
CPC .. *H01L 21/02565* (2013.01); *H01L 21/02631* (2013.01); *H01L 21/02694* (2013.01);
(Continued)

(58) Field of Classification Search
CPC ......... H01L 21/02565; H01L 21/02694; H01L 21/02631; H01L 29/66742;
(Continued)

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1443130 A    8/2004
EP    1737044 A    12/2006
(Continued)

OTHER PUBLICATIONS

Kamiya.T et al., "Origins of High Mobility and Low Operation Voltage of Amorphous Oxide TFTs: Electronic Structure, Electron Transport, Defects and Doping", Journal of Display Technology, Jul. 1, 2009, vol. 5, No. 7, pp. 273-288.
(Continued)

*Primary Examiner* — Jarrett Stark
(74) *Attorney, Agent, or Firm* — Robinson Intellectual Property Law Office; Eric J. Robinson

(57) ABSTRACT

One object is to have stable electrical characteristics and high reliability and to manufacture a semiconductor device including a semi-conductive oxide film. Film formation is performed by a sputtering method using a target in which gallium oxide is added to a material that is easy to volatilize compared to gallium when the material is heated at 400° C. to 700° C. like zinc, and a formed film is heated at 400° C. to 700° C., whereby the added material is segregated in the vicinity of a surface of the film and the oxide is crystallized. Further, a semi-conductive oxide film is deposited thereover,
(Continued)

whereby a semi-conductive oxide having a crystal which succeeds a crystal structure of the oxide that is crystallized by heat treatment is formed.

21 Claims, 6 Drawing Sheets

Related U.S. Application Data continuation of application No. 13/211,504, filed on Aug. 17, 2011, now Pat. No. 8,685,787.

(51) Int. Cl.
- H01L 29/786 (2006.01)
- H01L 29/26 (2006.01)
- H01L 29/66 (2006.01)

(52) U.S. Cl.
CPC .......... *H01L 29/26* (2013.01); *H01L 29/4908* (2013.01); *H01L 29/66742* (2013.01); *H01L 29/66969* (2013.01); *H01L 29/7869* (2013.01); *H01L 29/78603* (2013.01); *H01L 29/78606* (2013.01)

(58) Field of Classification Search
CPC ......... H01L 29/78603; H01L 29/78606; H01L 29/66969; H01L 29/26; H01L 29/4908; H01L 29/7869
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,838,308 B2 | 1/2005 | Haga |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 8,299,461 B2 | 10/2012 | Tanaka et al. |
| 8,344,387 B2 | 1/2013 | Akimoto et al. |
| 8,384,076 B2 | 2/2013 | Park et al. |
| 8,421,083 B2 | 4/2013 | Yamazaki et al. |
| 8,426,868 B2 | 4/2013 | Akimoto et al. |
| 8,546,182 B2 | 10/2013 | Akimoto et al. |
| 8,552,434 B2 | 10/2013 | Akimoto et al. |
| 9,130,049 B2 | 9/2015 | Sano et al. |
| 9,583,637 B2 | 2/2017 | Sano et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0023432 A1 | 2/2004 | Haga |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0267064 A1 | 10/2009 | Yano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0065845 A1 | 3/2010 | Nakayama |
| 2010/0092800 A1 | 4/2010 | Itagaki et al. |
| 2010/0109002 A1 | 5/2010 | Itagaki et al. |
| 2010/0109003 A1 | 5/2010 | Akimoto et al. |
| 2010/0117078 A1 | 5/2010 | Kuwabara et al. |
| 2010/0134735 A1 | 6/2010 | Nakamura et al. |
| 2011/0006301 A1 | 1/2011 | Yamazaki et al. |
| 2011/0114944 A1 | 5/2011 | Yamazaki et al. |
| 2011/0127523 A1 | 6/2011 | Yamazaki |
| 2011/0140109 A1 | 6/2011 | Yamazaki et al. |

(56) References Cited

U.S. PATENT DOCUMENTS

| | | |
|---|---|---|
| 2012/0049183 A1 | 3/2012 | Yamazaki |
| 2014/0030846 A1 | 1/2014 | Akimoto et al. |
| 2017/0125605 A1 | 5/2017 | Sano et al. |

FOREIGN PATENT DOCUMENTS

| | | |
|---|---|---|
| EP | 2120267 A | 11/2009 |
| EP | 2226847 A | 9/2010 |
| EP | 2408011 A | 1/2012 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-137692 A | 5/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2007-096055 A | 4/2007 |
| JP | 2007-123861 A | 5/2007 |
| JP | 2009-278115 A | 11/2009 |
| JP | 2010-040552 A | 2/2010 |
| JP | 2010-153842 A | 7/2010 |
| JP | 2010-287735 A | 12/2010 |
| WO | WO-2004/114391 | 12/2004 |
| WO | WO-2006/051993 | 5/2006 |

OTHER PUBLICATIONS

European Search Report (Application No. 11178637.2) Dated Oct. 20, 2011.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

(56) References Cited

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies In ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

(56) References Cited

OTHER PUBLICATIONS

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Kamiya.T et al., "Self-Adjusted, Three-Dimensional Lattice-Matched Buffer Layer for Growing ZnO Epitaxial Film: Homologous Series Layered Oxide, InGaO3(ZnO)5", Crystal Growth & Design, Sep. 27, 2006, vol. 6, No. 11, pp. 2451-2456.

Taiwanese Office Action (Application No. 100129561) Dated Jun. 23, 2015.

Taiwanese Office Action (Application No. 104142086) Dated Sep. 19, 2016.

MANUFACTURING METHOD OF SEMICONDUCTOR DEVICE

BACKGROUND OF THE INVENTION

1. Field of the Invention

The present invention relates to a semiconductor device including a semi-conductive oxide and a manufacturing method thereof.

In this specification, a semiconductor device generally means a device which can function by utilizing semiconductor characteristics, and an electro-optical device, a semiconductor circuit, and electronic devices are all semiconductor devices.

2. Description of the Related Art

In recent years, a technique for forming transistors using a semiconductor thin film (with a thickness of approximately several tens to several hundreds of nanometers) formed over a substrate having an insulating surface has attracted attention. Transistors are applied to a wide range of electronic devices like integrated circuits and electro-optical devices, and transistors that are to be used as switching elements in image display devices, in particular, has been developed.

Some oxides have semiconductor characteristics. Examples of such oxides having semiconductor characteristics are a tungsten oxide, a tin oxide, and an indium-gallium-zinc-based oxide (In—Ga—Zn-based oxide), and a thin film transistor in which such an oxide having semiconductor characteristics is used for a channel formation region is known (see Patent Documents 1 and 2). Further, in particular, properties of an In—Ga—Zn-based oxide also have been researched (Non-Patent Document 1).

REFERENCE

[Patent Document 1] Japanese Published Patent Application No. 2007-123861

[Patent Document 2] Japanese Published Patent Application No. 2007-96055

NON-PATENT DOCUMENT

[Non-Patent Document 1]

Toshio Kamiya, Kenji Nomura, and Hideo Hosono, "Origins of High Mobility and Low Operation Voltage of Amorphous Oxide TFTs: Electronic Structure, Electron Transport, Defects and Doping", *Journal of Display Technology*, Vol. 5, No. 7, 2009, pp. 273-288.

SUMMARY OF THE INVENTION

It is known that the conductivity of a semi-conductive oxide varies when hydrogen or water enters the semi-conductive oxide. Such a phenomenon becomes a factor of variation in the electrical characteristics of a transistor using the semi-conductive oxide. In addition, electrical characteristics of a semiconductor device using the semi-conductive oxide vary when the semiconductor device is irradiated with visible light or ultraviolet light.

In view of the above problems, one object is to provide a semiconductor device including a semi-conductive oxide film which has stable electrical characteristics and high reliability. Another object is to provide a manufacturing process of a semiconductor device, which can mass-produce highly reliable semiconductor devices using a large substrate such as mother glass.

It is an object to provide a novel semiconductor device. It is another object to provide a manufacturing method of a novel semiconductor device.

According to one embodiment of the present invention disclosed in this specification, a manufacturing method of a semiconductor device includes the steps of: forming a first film that contains an oxide including at least a first metal element and a second metal element, over a substrate; performing heat treatment on the first film, and forming a first layer that contains a crystal of an oxide including the first metal element as a main metal component and a second layer that is on a side closer to the substrate than the first layer and contains an oxide including the second metal element as a main metal component; and forming a second film that is in contact with the first layer and contains an oxide, and performing heat treatment.

In the above method, the second film may be a semi-conductive oxide film. A semi-conductive oxide to be used preferably contains at least indium (In) or zinc (Zn). In particular, In and Zn are preferably contained. As a stabilizer for reducing change in electrical characteristics of a transistor using the semi-conductive oxide, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lantern (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the semi-conductive oxide, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main metal component, in which there is no particular limitation on the ratio of In:Ga:Zn. In addition to In, Ga, and Zn, a metal element may be contained.

An oxide represented by the chemical formula $InMO_3(ZnO)_m$ (m>0) can also be used. Here, M represents one or more metal elements selected from Zn, Ga, Al, Sn, and In. For example, M can be Ga or two kinds of metals such as Ga and Al, Ga and Sn, or Ga and In.

In the case where an In—Zn-based oxide is used as a semi-conductive oxide, a target to be used has a composition ratio of In:Zn=50:1 to 1:2 in an atomic ratio ($In_2O_3$:ZnO=25:1 to 1:4 in a molar ratio), preferably, In:Zn=1:1 to 1:20 in an atomic ratio (In$_2$O$_3$:ZnO=10:1 to 1:2 in a molar ratio), further preferably, In:Zn=1.5:1 to 15:1 in an atomic ratio (In$_2$O$_3$:ZnO=3:4 to 15:2 in a molar ratio). For example, a target used for the formation of an In—Zn-based oxide has an atomic ratio of In:Zn:O=1:1:X, where X>1, preferably X>1.5.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The semi-conductive oxide may be either single crystal or non-single-crystal. In the latter case, the semi-conductive oxide may be either amorphous or polycrystal. Further, the semi-conductive oxide may have either an amorphous structure including a portion having crystallinity or a non-amorphous structure.

In the above method, the ratio of the second metal element to a metal element in the second film may be greater than or equal to 0.2. The first film may be formed at a temperature higher than or equal to 200° C. and lower than or equal to 400° C.

In the above method, the first film may be formed by any of the following methods: a microwave plasma sputtering method (a sputtering method using a microwave with a frequency of higher than or equal to 100 MHz), an RF sputtering method (a sputtering method using an electromagnetic wave with a frequency of higher than or equal to 1 kHz and lower than 100 MHz), an AC sputtering method (a sputtering method using AC with a frequency of lower than 1 kHz, typically, lower than or equal to 100 Hz, the AC sputtering method is also referred to as a cycle sputtering method), and a DC sputtering method (including a sputtering method using DC and a pulsed DC sputtering method by which voltage is applied in a pulsed manner).

In particular, an AC sputtering method or a DC sputtering method is preferably employed in consideration of mass productivity of formation or the like of a film over a large substrate. In a normal DC sputtering method by which constant voltage is applied, abnormal arc discharge is generated in some cases. This phenomenon is remarkable in deposition of a conductive oxide. Voltage is preferably applied in a pulsed manner in order to prevent the abnormal arc discharge. This method is referred to as a pulsed DC sputtering method. It is not necessary to prevent the abnormal arc discharge in an AC sputtering method; therefore, the proportion of plasma generation time by the AC sputtering method is twice or more as high as that by a pulsed DC sputtering method and favorable mass productivity is achieved.

In the above method, heat treatment is performed at higher than or equal to 200° C., preferably higher than or equal to 400° C. and lower than 700° C. In addition, the atmosphere of the heat treatment may be an atmosphere including oxygen or nitrogen. Further, the pressure may be greater than or equal to 10 Pa and less than or equal to 1 normal atmospheric pressure.

According to one embodiment of the present invention disclosed in this specification, a semiconductor device includes: a substrate; an insulating oxide layer over the substrate; and a semi-conductive oxide layer provided in contact with the insulating oxide layer. The semi-conductive oxide layer includes at least a first metal element and a second metal element. The concentration of the first metal element in a portion in the insulating oxide layer in contact with the semi-conductive oxide layer is higher than the concentration of the first metal element in a portion facing the substrate. The concentration of the second metal element in the portion in the insulating oxide layer in contact with the semi-conductive oxide layer is lower than the concentration of the second metal element in the portion facing the substrate.

In the above semiconductor device, the first metal element may be zinc. The second metal element may be gallium. In the above semiconductor device, the semi-conductive oxide layer may include an amorphous state. The semi-conductive oxide layer may include a crystal. The semi-conductive oxide layer may be in a single crystal state. In addition, the crystal may have a structure in which a c-axis is oriented on a plane perpendicular to the substrate (c-axis-oriented structure).

The present inventor has found a phenomenon in which, when a gallium oxide film containing zinc is subjected to heat treatment, zinc is segregated to a surface to be crystallized. In other words, zinc, which has been uniformly distributed in the film initially, is segregated to the surface by heat treatment, thereby becoming a crystal having extremely high crystallinity formed mainly from zinc oxide. On the other hand, the zinc concentration is low enough to obtain sufficient insulating properties in the other portion.

For example, it can be found from the description of FIG. 12 of Non-Patent Document 1 that in a substance in which zinc oxide and gallium oxide are mixed with each other in a ratio of 50:50, conductivity of $5 \times 10^{-3}$ $\Omega^{-1}$ cm$^{-1}$ is obtained in an amorphous state. On the other hand, a substance in which zinc oxide and gallium oxide are mixed with each other in a ratio of 25:75 has a sufficiently insulating property.

This phenomenon is caused because the vapor pressure of zinc is higher than the vapor pressure of gallium in the above heat treatment conditions. Therefore, this phenomenon is caused not only when gallium and zinc are used. This phenomenon might be caused if such a condition is satisfied even when two or more metal elements other than gallium and zinc are combined. For example, an oxide including gallium, aluminum, and zinc may be used instead of an oxide including gallium and zinc.

Further, when the concentration of zinc in the oxide film is measured, the concentration is extremely high in the vicinity of the surface where a crystal of a zinc oxide is provided, and tends to increase in the direction to the surface except for the vicinity of the surface. On the other hand, the concentration of gallium tends to decrease in the direction to the surface. Such a phenomenon is also caused because the vapor pressure of zinc is higher than the vapor pressure of gallium.

In addition, the present inventor has found that, by depositing a semi-conductive oxide which has favorable crystalline consistency with zinc oxide and performing heat treatment at the time when a gallium oxide film is in contact with such a crystal of zinc oxide to become a crystal, a semi-conductive oxide having excellent crystallinity can be obtained at relatively low temperature.

For example, an oxide in which In:Ga:Zn=1:1:N (N is 0.5 or a natural number) has a lattice constant that is very close to that of zinc oxide. When a film having such a composition or a composition close thereto is deposited over the crystallized zinc oxide and is subjected to heat treatment at 400° C. to 700° C., crystal growth proceeds using zinc oxide as a nucleus, whereby a crystal which is highly c-axis-oriented is obtained while reflecting crystallinity of zinc oxide. The crystal may be highly crystallized to be seen as a single crystal or may include an amorphous state, depending on heating temperature and time.

Such a phenomenon is known as heteroepitaxial growth. In the above-described example, crystal growth of an In—Ga—Zn-based oxide is performed using zinc oxide as a nucleus; similarly, crystal growth of other materials can be conducted.

When a crystalline semi-conductive oxide layer obtained in such a manner is used for a transistor, a transistor which has stable electrical characteristics and high reliability can be achieved. Further, when heat treatment temperature is lower than or equal to 450° C., mass production of highly reliable semiconductor devices using a large glass substrate can be performed.

A process of film formation and a process of heat treatment for forming another crystalline semi-conductive oxide layer over the crystalline semi-conductive oxide layer which is obtained in such a manner may be repeated.

With the above-described embodiment, at least one of the problems can be resolved. Even when a transistor having a layered structure of the first crystalline semi-conductive oxide layer and the second crystalline semi-conductive oxide layer is irradiated with light or subjected to a bias-temperature stress (BT) test, the amount of change in threshold voltage of the transistor can be reduced, and the transistor has stable electrical characteristics.

DETAILED DESCRIPTION OF THE INVENTION

Figure 1A:
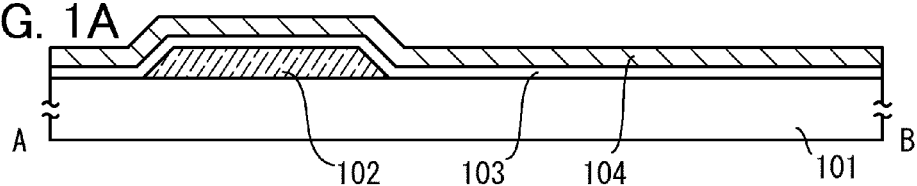
FIGS. 1A to 1F are cross-sectional views of a manufacturing process according to Embodiment 1.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

The structures, the conditions, and the like disclosed in any of the following embodiments can be combined with those disclosed in other embodiments as appropriate. Note that in structures described below, the same portions or portions having similar functions are denoted by the same reference numerals in different drawings, and detailed description thereof is not repeated in some cases.

Note that in the following embodiments, an example where the technical idea of the present invention is applied to a display device including a transistor is mainly given; however, it can be easily understood that the technical idea of the present invention is not limited to being applied to a display device. Further, terms such as "gate", "source", and "drain" used in the embodiments are used for simple description and are not limited to the interpretation of the meanings of the terms.

For example, "a conductive region and a region incorporated therewith provided so as to get across a semiconductor region over an insulating film provided over the semiconductor region" when normally expressed is simply referred to as a "gate electrode". Further, a source and a drain are not particularly distinguished in this specification, when one is referred to as a source, the other is referred to as a drain.

In addition, it should be noted that the terms such as a conductive oxide, a semi-conductive oxide, and an insulating oxide used in this specification do not have absolute meanings Even when an oxide has the same composition and the same properties, a name is changed in accordance with the usage in some cases. For example, when an oxide is used for a target of DC sputtering, it is referred to as a conductive oxide. When an oxide is used for a semiconductor layer of a transistor, it is referred to as a semi-conductive oxide in some cases.

An oxide in this specification is an oxide in which the percentage of nitrogen, oxygen, fluorine, sulfur, selenium, chlorine, bromine, tellurium, and iodine (in a molar ratio) contained in a substance (including a compound) is higher than or equal to 25% of the total and the percentage of oxygen to the above elements (in a molar ratio) is higher than or equal to 70%.

A metal element in this specification refers to all elements other than a rare gas element, hydrogen, boron, carbon, nitrogen, a Group 16 element (e.g., oxygen), a Group 17 element (e.g., fluorine), silicon, phosphorus, germanium, arsenic, and antimony.

Further, in this specification, "one metal element is a main metal element" indicates the case where among a plurality of metal elements in a substance, the composition of the metal element is greater than or equal to 50% of the metal elements. In addition, "n metal elements $M_1$, $M_2$, . . . , and $M_n$ are main metal elements" indicates the case where the sum of compositions of the metal elements $M_1$, $M_2$, . . . , and $M_n$ is higher than or equal to $\{(1-2^{-n})\times 100\}[\%]$ of the metal elements.

Note that the concentration of an element which is not a main component in a film denoted in this specification is determined by a secondary ion mass spectrometry method unless otherwise specified. In general, when the concentration of an element in a depth direction of a single-layer or multilayer film is measured by a secondary ion mass spectrometry method, in particular in the case of a small amount of an element, the concentration of the element tends to be unusually high at an interface between the substrate and the film or between the films; however, the concentration of such a portion is not an accurate value and measurement variations are large.

It is desirable that the concentration in the vicinity of an interface with low reliability be prevented from being employed and the concentration of a portion which has a stable concentration be used as an index for the accurate concentration of a film; therefore, as the concentration determined by a secondary ion mass spectrometry method, the minimum value obtained by analyzing the object is used in this specification.

(Embodiment 1)

In this embodiment, an example in which a display device having a transistor is formed using the above-described technical idea will be described. FIGS. 1A to 1F illustrate a cross section of a manufacturing process of the display device of this embodiment. The transistor described in this embodiment is a bottom-gate transistor whose gate electrode is located on the substrate side and a top-contact transistor whose source electrode and drain electrode are in contact with a top surface of a semiconductor layer, and a semiconductive oxide is used as a semiconductor.

The outline of a manufacturing process will be described below. As illustrated in FIG. 1A, a gate electrode 102, a first gate insulator 103 of silicon oxide, silicon oxynitride, or the like, and an oxide film 104 are formed over a substrate 101 having an insulating surface. The first gate insulator 103 is not necessarily provided. In addition, the oxide film 104 is an oxide of gallium and zinc in this embodiment, and the ratio of gallium, that is, Ga/(Ga+Zn), may be greater than or equal to 0.2 and less than 0.8, preferably greater than or equal to 0.3 and less than 0.7.

There is no particular limitation on a substrate which can be used for the substrate 101; however, the substrate needs to have an insulating surface. For example, a glass substrate made of barium borosilicate glass, aluminoborosilicate glass, or the like can be used; however, one embodiment of the present invention is not limited to this. An insulator such as quartz or sapphire, or a semiconductor having sufficiently high insulating properties, such as silicon carbide, may be used. Further, an insulating film may be formed on a surface of a semiconductor whose insulating properties are not high such as silicon, germanium, or gallium arsenide, on a surface of a semiconductor whose conductivity is increased by doping, or on a surface of copper, aluminum, or the like.

In the case where unfavorable impurities for a transistor are included in a substrate, it is preferable that a film of an insulating material having a function of blocking the impurities (e.g., aluminum nitride, aluminum oxide, or silicon nitride) be provided on a surface. Note that in this embodiment, the first gate insulator 103 can have a similar function.

The gate electrode 102 can be formed in a single layer or a stacked layer using a metal element such as molybdenum, titanium, chromium, tantalum, tungsten, aluminum, or copper, or an alloy material which includes any of these materials as a main metal element. Because the threshold value or the like of the obtained transistor is changed due to a work function of a material to be used for the gate electrode 102, it is necessary to select a material in accordance with the threshold voltage which is required.

It is necessary to determine the thickness of the first gate insulator 103 in accordance with the composition and thickness of the oxide film 104. Descriptions thereof will be made later. The first gate insulator 103 may be formed by a known sputtering method, a CVD method, or the like.

The oxide film 104 is formed by a microwave plasma sputtering method, an RF plasma sputtering method, an AC sputtering method, or a DC sputtering method. Determination of which method is to be employed may be performed in consideration of the conductivity of a target, the size of the target, the area of a substrate, or the like.

A target to be used may be an oxide in which the ratio of gallium to zinc is adjusted so that the oxide film 104 takes the above-mentioned value. Note that in sputtering, the composition of the target is different from the composition of the obtained film depending on an atmosphere and temperature of a deposition surface; for example, even when a conductive target is used, the concentration of zinc of the obtained film is decreased, so that the obtained film has insulating properties or semiconductivity in some cases.

In this embodiment, an oxide of zinc and gallium is used; the vapor pressure of zinc at higher than or equal to 200° C. is higher than that of gallium. Therefore, when the substrate 101 is heated at higher than or equal to 200° C., the concentration of zinc of the oxide film 104 is lower than the concentration of zinc of the target. Accordingly, in consideration of the fact, it is necessary that the concentration of zinc of the target be set at a higher concentration. When the concentration of zinc is increased in general, the conductivity of an oxide is improved; therefore, a DC sputtering method is preferably used.

The target for sputtering can be obtained in such a manner that after a powder of gallium oxide and a powder of zinc oxide are mixed and pre-baked, molding is performed; then, baking is performed. Alternatively, it is preferable that a powder of gallium oxide whose grain size is less than or equal to 100 nm and a powder of zinc oxide whose grain size is less than or equal to 100 nm be sufficiently mixed and molded.

The oxide film 104 is desirably formed by a method in which hydrogen, water, or the like does not easily enter the oxide film 104. The atmosphere in film formation may be a rare gas (typically argon) atmosphere, an oxygen atmosphere, a mixed atmosphere of a rare gas and oxygen, or the like. Moreover, it is desirably an atmosphere using a high-purity gas from which impurities such as hydrogen, water, a hydroxyl group, and hydride are sufficiently removed because entry of hydrogen, water, a hydroxyl group, and hydride into the oxide film 104 can be prevented.

The entry of the impurities can also be prevented when the substrate temperature in film formation is set to higher than or equal to 100° C. and lower than or equal to 600° C., preferably higher than or equal to 200° C. and lower than or equal to 400° C. In addition, an entrapment vacuum pump such as a cryopump, an ion pump, or a titanium sublimation pump or a turbo molecular pump provided with a cold trap may be used as an evacuation unit.

In the deposition chamber which is evacuated with the above-described evacuation unit, a hydrogen molecule, a compound containing a hydrogen atom such as water ($H_2O$), (preferably, also a compound containing a carbon atom), and the like are removed. Accordingly, the concentration of impurities in the oxide film 104 formed in the deposition chamber can be reduced.

Figure 1B:
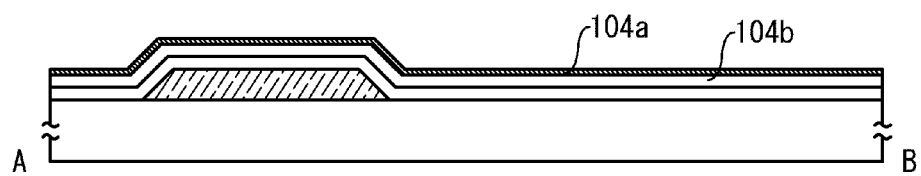

Next, the substrate 101 provided with these is heated at 400° C. to 700° C. for 10 minutes to 24 hours under an appropriate atmosphere, for example, under the condition that the pressure is 10 Pa to 1 normal atmospheric pressure and an atmosphere is any of an oxygen atmosphere, a nitrogen atmosphere, and a mixed atmosphere of oxygen and nitrogen. Then, the quality of the oxide film 104 is changed as illustrated in FIG. 1B, and a semi-conductive oxide layer 104a having high concentration of zinc is formed in the vicinity of a surface of the oxide film 104, and another portion becomes an insulating oxide layer 104b having low concentration of zinc.

Note that as a heating period is longer, heating temperature is higher, and the pressure in heating is lower, zinc is easily evaporated and the semi-conductive oxide layer 104a tends to be thin.

The thickness of the semi-conductive oxide layer 104a is preferably 3 nm to 15 nm. The thickness of the semi-conductive oxide layer 104a can be controlled by heating time, heating temperature, and pressure at the time of heating as described above, or by the composition and thickness of the oxide film 104. The composition of the oxide film 104 can be controlled by substrate temperature in film formation, as well as the composition of the target; therefore, these may be set as appropriate.

The obtained semi-conductive oxide layer 104a has crystallinity; in an X-ray diffraction analysis of a crystal structure, the ratio of the diffraction intensity of an a plane or a b plane to the diffraction intensity of a c plane is greater than or equal to 0 and less than or equal to 0.3, showing c-axis orientation properties. In this embodiment, the semi-conductive oxide layer 104a is an oxide in which zinc is a main metal component.

On the other hand, the ratio of gallium, that is, Ga/(Ga+Zn) in the insulating oxide layer 104b may be greater than or equal to 0.7, preferably greater than or equal to 0.8. Note that the ratio of gallium in the insulating oxide layer 104b in a portion close to the surface, for example, in a portion in contact with the semi-conductive oxide layer 104a has the lowest value and the ratio is increased toward the substrate. In contrast, the ratio of zinc in the portion close to the surface has the highest value and the ratio is decreased toward the substrate.

Note that in this heat treatment, an alkali metal such as lithium, sodium, or potassium is also segregated in the vicinity of the surface of the semi-conductive oxide layer 104a and evaporated; therefore, the concentration in the semi-conductive oxide layer 104a and the concentration in the insulating oxide layer 104b are sufficiently reduced. These alkali metals are unfavorable elements for a transistor; thus, it is preferable that these alkali metals be contained in a material used for forming the transistor as little as possible. Since these alkali metals are easily evaporated compared to zinc; therefore, a heat treatment step is advantageous in removing these alkali metals.

By such treatment, for example, the concentration of sodium in each of the semi-conductive oxide layer 104a and the insulating oxide layer 104b may be less than or equal to $5 \times 10^{16}$ cm$^{-3}$, preferably less than or equal to $1 \times 10^{16}$ cm$^{-3}$, more preferably less than or equal to $1 \times 10^{15}$ cm$^{-3}$. Similarly, the concentration of lithium in each of the semi-conductive oxide layer 104a and the insulating oxide layer 104b may be less than or equal to $5 \times 10^{15}$ cm$^{-3}$, preferably less than or equal to $1 \times 10^{15}$ cm$^{-3}$; the concentration of potassium in each of the semi-conductive oxide layer 104a and the insulating oxide layer 104b may be less than or equal to $5 \times 10^{15}$ cm$^{-3}$, preferably less than or equal to $1 \times 10^{15}$ cm$^{-3}$.

The insulating oxide layer 104b obtained in this manner functions as a gate insulator of the transistor. In other words, the thickness of the gate insulator of the transistor is the sum of the thickness of the first gate insulator 103 and the thickness of the insulating oxide layer 104b. Therefore, the thickness of the first gate insulator 103 needs to be determined in consideration of the insulating oxide layer 104b.

The thickness of the insulating oxide layer 104b depends not only on the thickness of the oxide film 104 but also on the ratio of zinc contained in the oxide film 104. In general, as the ratio of zinc is higher, the insulating oxide layer 104b becomes thinner. Therefore, the thickness of the first gate insulator 103 needs to be determined in accordance with the composition and thickness of the oxide film 104, as described above.

For example, in the case of a transistor used for a general liquid crystal display device or a general electroluminescence display device, the thickness of a gate insulator is 50 nm to 1 μm. For example, in the case where the thickness of the oxide film 104 is 200 nm and the ratio of gallium, that is, Ga/(Ga+Zn) in the oxide film 104 is 0.5, the thickness of the obtained insulating oxide layer 104b is 100 nm to 150 nm. Note that the dielectric constant of the insulating oxide layer 104b is approximately 2.5 times as high as that of silicon oxide because gallium is a main metal element.

In the case where the first gate insulator 103 is formed using silicon oxide and the silicon oxide equivalent thickness of the total gate insulator (the first gate insulator 103 and the insulating oxide layer 104b) is 200 nm, the thickness of the first gate insulator 103 may be 140 nm to 160 nm.

Note that the optimum thickness of the gate insulator is set by voltage applied to the gate electrode or the like, as appropriate. In general, in the case where the applied voltage is low, the gate insulator is set to be thin, whereas in the case where the applied voltage is high, the gate insulator is set to be thick.

In this embodiment, the insulating oxide layer 104b in which gallium is a main metal element is represented by a chemical formula: $Ga_xZn_{1-x}O_y$ (note that X≥0.7); however, it is preferable that oxygen exceed a stoichiometric ratio so as to satisfy $x/2+1<y<x/2+1.5$.

Note that an impurity element, e.g., a Group 3 element such as yttrium, a Group 4 element such as hafnium, or a Group 13 element such as aluminum is contained in the oxide film 104, the energy gap of the insulating oxide layer 104b to be obtained later may be increased and the insulating properties may be enhanced. The energy gap of gallium oxide which does not contain any of the above impurities is 4.9 eV; however, when the gallium oxide contains any of the above impurities at about, for example, greater than 0 atomic % and less than or equal to 20 atomic %, the energy gap can be increased to about 6 eV.

Figure 1C:
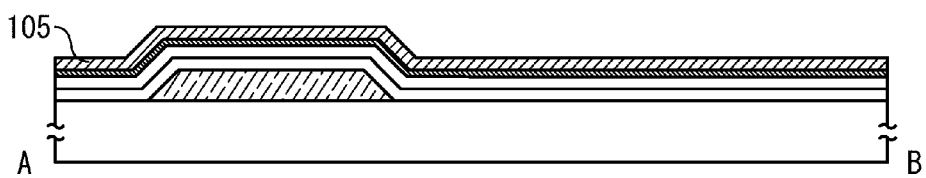
Figure 1D:
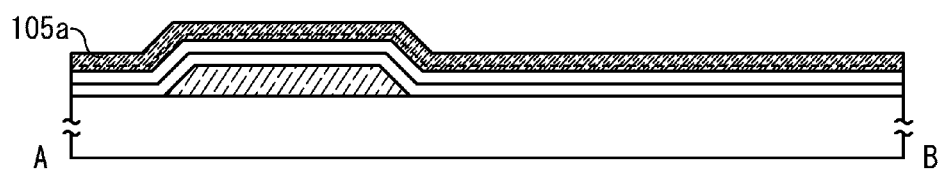

Then, a semi-conductive oxide film 105 is formed as illustrated in FIG. 1C. In this embodiment, an In—Ga—Zn-based oxide is used as a semi-conductive oxide. In other words, the semi-conductive oxide film is formed using an In—Ga—Zn-based oxide as a target by a sputtering method. The filling rate of the oxide target is higher than or equal to 90% and lower than or equal to 100%, preferably, higher than or equal to 95% and lower than or equal to 99.9%. With the use of the oxide target with high filling rate, a semi-conductive oxide film to be obtained can have high density.

The composition ratio of the target can be, for example, In:Ga:Zn=1:1:1 [molar ratio]. Note that it is not necessary to limit the material and composition ratio of the target to the above. For example, an oxide target with the following composition ratio may alternatively be used: In:Ga:Zn=1:1:0.5 [molar ratio], In:Ga:Zn=2:1:3 [molar ratio], and In:Ga:Zn=3:1:2 [molar ratio].

As described later, as for the composition of an obtained semi-conductive oxide film, it is preferable that the ratio of gallium in a metal component (molar ratio) be greater than or equal to 0.2. For example, in the case where In:Ga:Zn=1: 1:1, the ratio of gallium is 0.33, whereas in the case where In:Ga:Zn=1:1:0.5, the ratio of gallium is 0.4.

The semi-conductive oxide film 105 is desirably formed by a method in which hydrogen, water, or the like does not easily enter the semi-conductive oxide film 105. The atmosphere in film formation may be a rare gas (typically argon) atmosphere, an oxygen atmosphere, a mixed atmosphere of a rare gas and oxygen, or the like. An atmosphere of a high-purity gas from which an impurity such as hydrogen, water, a hydroxyl group, or hydride is removed is preferable, in order to prevent hydrogen, water, a hydroxyl group, hydride, or the like from entering the semi-conductive oxide film 105.

The thickness of the semi-conductive oxide film 105 is desirably greater than or equal to 3 nm and less than or equal to 30 nm. This is because when the thickness of the semi-conductive oxide film is too large (e.g., when the thickness is greater than or equal to 50 nm), the transistor might be normally on.

The entry of the impurities can also be prevented when the substrate temperature in film formation is set to higher than or equal to 100° C. and lower than or equal to 600° C., preferably higher than or equal to 200° C. and lower than or equal to 400° C. In addition, an entrapment vacuum pump such as a cryopump, an ion pump, or a titanium sublimation pump or a turbo molecular pump provided with a cold trap may be used as an evacuation unit.

In the deposition chamber which is evacuated with the above-described evacuation unit, a hydrogen molecule, and a compound containing a hydrogen atom such as water ($H_2O$) as well as a compound containing a carbon atom are removed. Accordingly, the concentration of impurities in the semi-conductive oxide film 105 formed in the deposition chamber can be reduced.

An alkali metal such as lithium, sodium, or potassium or an alkaline-earth metal is unfavorable element for the case where a semi-conductive oxide is used for a transistor; therefore, it is preferable that an alkali metal or an alkaline-earth metal be contained in a material used for forming the transistor as little as possible.

Of alkali metals, in particular, sodium is dispersed in an insulating oxide which is in contact with a semi-conductive oxide to be a sodium ion. Alternatively, sodium cuts a bond between a metal element and oxygen or enters the bond in the semi-conductive oxide. As a result, transistor characteristics deteriorate (e.g., the transistor becomes normally-on (the shift of a threshold voltage to a negative side) or the mobility is decreased). In addition, this also causes variation in the characteristics.

Such a problem is significant especially in the case where the concentration of hydrogen in the semi-conductive oxide is extremely low. Therefore, the concentration of an alkali metal is strongly required to be extremely low in the case where the concentration of hydrogen in the semi-conductive oxide is lower than or equal to $5 \times 10^{19}$ cm$^{-3}$, particularly lower than or equal to $5 \times 10^{18}$ cm$^{-3}$.

For example, the concentration of sodium in the semi-conductive oxide film 105 may be less than or equal to $5 \times 10^{16}$ cm$^{-3}$, preferably less than or equal to $1 \times 10^{16}$ cm$^{-3}$, more preferably less than or equal to $1 \times 10^{15}$ cm$^{-3}$. Similarly, the concentration of lithium in the semi-conductive oxide film 105 may be less than or equal to $5 \times 10^{15}$ cm$^{-3}$, preferably less than or equal to $1 \times 10^{15}$ cm$^{-3}$; the concentration of potassium in the semi-conductive oxide film 105 may be less than or equal to $5 \times 10^{15}$ cm$^{-3}$, preferably less than or equal to $1 \times 10^{15}$ cm$^{-3}$.

Then, heat treatment (first heat treatment) is performed on the semi-conductive oxide film 105. By the first heat treatment, crystal growth of the semi-conductive oxide film 105 is carried out using a crystal of the semi-conductive oxide layer 104*a* as a nucleus, and a semi-conductive oxide film 105*a* which is c-axis-oriented is obtained as in FIG. 1D.

At the same time, excessive hydrogen (including water and a hydroxyl group) in the semi-conductive oxide film 105 can be removed; the structure of the semi-conductive oxide film 105 can be improved; and defect levels in the energy gap can be reduced.

Further, excessive hydrogen (including water and a hydroxyl group) in the first gate insulator 103 and the insulating oxide layer 104*b* can also be removed by the first heat treatment. The temperature of the first heat treatment is higher than or equal to 250° C. and lower than or equal to 650° C.

As a result of the first heat treatment, the semi-conductive oxide layer 104*a* and the semi-conductive oxide film 105 are integrated with each other to be the semi-conductive oxide film 105*a*; therefore, an interface between the semi-conductive oxide layer 104*a* and the semi-conductive oxide film 105 is not clear.

The first heat treatment can be performed in such a manner that, for example, an object is introduced into an electric furnace in which a resistance heating element or the like is used and heated under a nitrogen atmosphere. During the first heat treatment, the semi-conductive oxide film 105 is not exposed to air to prevent entry of water and hydrogen.

The heat treatment apparatus is not limited to the electric furnace and may be an apparatus for heating an object by thermal radiation or thermal conduction from a medium such as a heated gas. For example, a rapid thermal anneal (RTA) apparatus such as a gas rapid thermal anneal (GRTA) apparatus or a lamp rapid thermal anneal (LRTA) apparatus can be used.

An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object by heat treatment, such as nitrogen or a rare gas such as argon is used.

For example, as the first heat treatment, the GRTA process may be performed as follows. The object is put in a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process. This is because defect levels in the energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The first heat treatment can be implemented not only just after the semi-conductive oxide film 105 is formed as described above but also at any timing after the semi-conductive oxide film 105 is formed. In addition, similar heat treatment may be performed plural times instead of one.

Figure 1E:
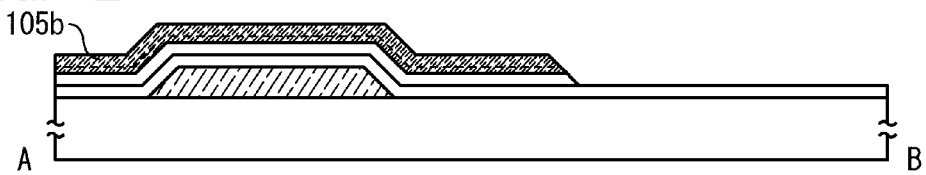

As illustrated in FIG. 1E, the semi-conductive oxide film 105a and the insulating oxide layer 104b are etched, whereby a semi-conductive oxide film 105b having a desired shape (e.g., island shape) is obtained. In the etching, a dry etching method or a wet etching method may be used. Note that as the etching here, the first gate insulator 103 may be used as an etching stopper.

Then, a semi-conductive oxide film having N-type conductivity and a conductive film of a metal or the like are deposited. For the formation of these films, a sputtering method may be used. For the N-type semi-conductive oxide film, indium oxide, indium tin oxide, zinc oxide, zinc aluminum oxide, or the like may be used. Note that the N-type semi-conductive oxide film is provided for reducing contact resistance between a source electrode and a drain electrode and the semi-conductive oxide film 105b; however, the N-type semi-conductive oxide film is not necessarily provided depending on the kinds of metals to be used for the source electrode and the drain electrode.

As the conductive film, for example, a metal film containing an element selected from aluminum, chromium, copper, tantalum, titanium, molybdenum, or tungsten, or a metal nitride film containing any of the above elements as a main metal component (e.g., a titanium nitride film, a molybdenum nitride film, or a tungsten nitride film) can be used.

Alternatively, a film of a high-melting-point metal such as titanium, molybdenum, or tungsten or a metal nitride film (e.g., a titanium nitride film, a molybdenum nitride film, or a tungsten nitride film) may be formed over or/and below the metal film such as an Al film or a Cu film.

Then, these are processed into desired shapes, and N-type semi-conductive oxide films 106a and 106b, a source electrode 107a, and a drain electrode 107b are formed. In the above manner, a basic structure of a transistor is completed. Note that in etching of the conductive film, part of the semi-conductive oxide film 105b is etched and a groove portion (depression portion) is formed in the semi-conductive oxide film 105b, in some cases.

Plasma treatment may be performed using an oxidizing gas such as oxygen or ozone, and the adsorbed water attached to the surface of the exposed semi-conductive oxide film 105b may be removed. Note that in the plasma treatment, it is preferable that the concentration of nitrogen or that of argon in the gas be less than 50%.

Further, a first insulator 108 is formed by a sputtering method, a CVD method, or the like. In the case where the plasma treatment is performed, it is preferable that the first insulator 108 be successively formed without the substrate 101 being taken out to an air atmosphere after the plasma treatment because an atmospheric component (in particular, water) is not adsorbed on the surface of the semi-conductive oxide film 105b.

The first insulator 108 can be formed typically using an inorganic insulator such as silicon oxide, silicon oxynitride, aluminum oxide, or aluminum oxynitride. In particular, it is preferable to use an oxide because of the reason to be described below, and oxygen that is equivalent to or exceeds the stoichiometric ratio is preferably contained.

The second heat treatment is preferably performed after the first insulator 108 is formed. The second heat treatment is performed at a temperature higher than or equal to 150° C. and lower than or equal to 600° C., preferably higher than or equal to 250° C. and lower than or equal to 450° C.

The second heat treatment may be performed in an atmosphere of nitrogen, oxygen, ultra-dry air (air in which the water content is less than or equal to 20 ppm, preferably less than or equal to 1 ppm, more preferably less than or equal to 10 ppb), or a rare gas (argon, helium, or the like). It is also preferable that the purity of nitrogen, oxygen, or the rare gas which is introduced into a heat treatment apparatus be set to be greater than or equal to 6 N, preferably greater than or equal to 7N (that is, the impurity concentration is less than or equal to 1 ppm, preferably less than or equal to 0.1 ppm).

In the second heat treatment, the semi-conductive oxide film 105b and the first insulator 108 are heated in a state where the semi-conductive oxide film 105b is in contact with the first insulator 108. Therefore, oxygen in the semi-conductive oxide film 105b, which might be reduced by the first heat treatment, can be supplied from the first insulator 108. Accordingly, charge trapping centers in the semi-conductive oxide film 105b can be decreased.

The first heat treatment and the second heat treatment are applied, whereby the semi-conductive oxide film 105b can be highly purified so as to contain impurities other than main components as little as possible. The highly purified semi-conductive oxide film 105b contains extremely few carriers derived from a donor. The carrier concentration can be less than $1 \times 10^{14}/cm^3$, preferably less than $1 \times 10^{12}/cm^3$, and more preferably less than $1 \times 10^{11}/cm^3$.

Figure 1F:
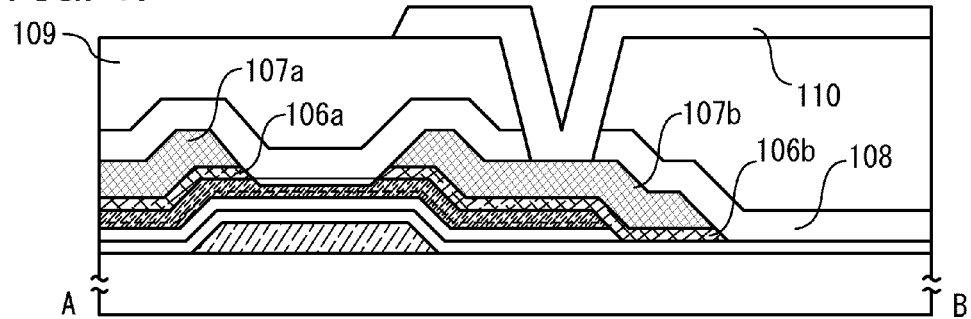

Next, a second insulator 109 which has a flat surface is formed. Various organic materials may be used for forming the second insulator 109. Then, the first insulator 108 and the second insulator 109 are selectively etched, so that a contact hole reaching the drain electrode 107b is formed. A display electrode 110 which is in contact with the drain electrode 107b through this contact hole is formed (FIG. 1F).

A light-transmitting material or a reflective material can be used for the display electrode 110. For the light-transmitting material, a conductive oxide whose band gap is greater than or equal to 3 electron-volts, such as an In—Sn-based oxide or a Zn—Al-based oxide, can be used. A metal nanowire or a carbon film (graphene or the like) with a thickness of less than or equal to 3 nm can also be used. For the reflective material, a film formed using any of various metal materials (aluminum, silver, and the like) can be used. The surface of a reflective display electrode is preferably provided with an irregular unevenness to display white color.

Figure 6A:
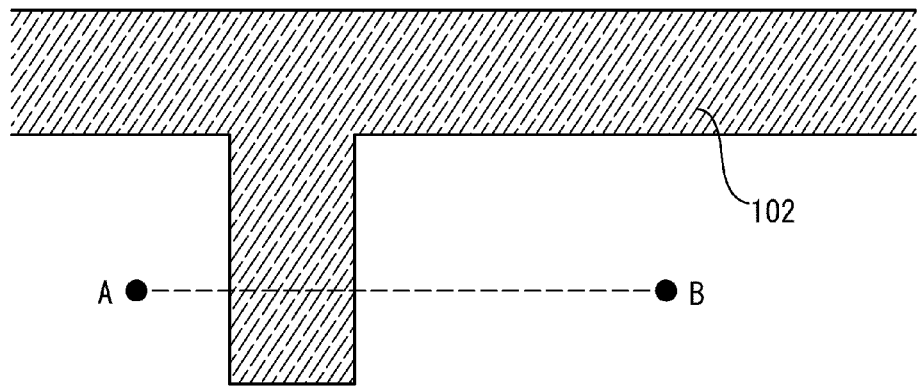
FIGS. 6A to 6C are diagrams illustrating one embodiment of a semiconductor device.
Figure 6B:
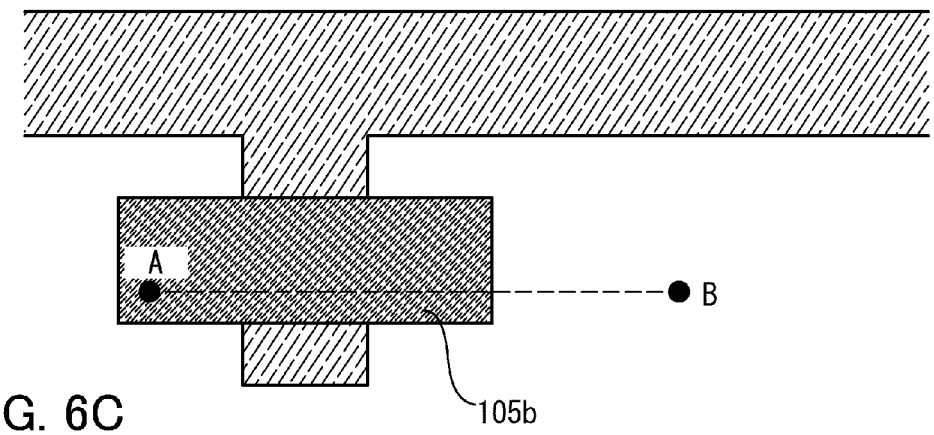
Figure 6C:
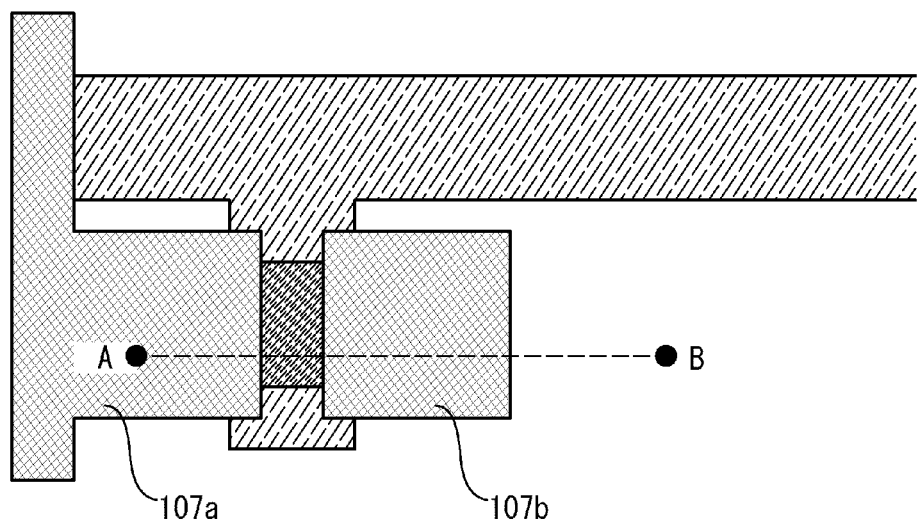

FIGS. 6A to 6C illustrate states of the above-described manufacturing process which are seen from above. A cross section taken along a dashed line connecting a point A and a point B in each of FIGS. 6A to 6C corresponds to FIGS. 1A to 1F. FIG. 6A corresponds to the state illustrated in FIG. 1A; here, the first gate insulator 103, the oxide film 104, and the like are not illustrated. FIG. 6B corresponds to the state illustrated in FIG. 1E. In addition, FIG. 6C illustrates an intermediate state between the step illustrated in FIG. 1E and the step illustrated in FIG. 1F. In other words, FIG. 6C illustrates a state just after the N-type semi-conductive oxide films 106a and 106b, the source electrode 107a, and the drain electrode 107b are formed after the step illustrated in FIG. 1E.

In this embodiment, the insulating oxide layer 104b in which gallium is a main metal element is used. When such a material is in contact with a semi-conductive oxide in which, in particular, the ratio of gallium in a metal element is greater than or equal to 0.2, charge trapping at an interface between the insulating oxide layer 104b and a semi-conductive oxide film can be sufficiently suppressed. Accordingly, a highly reliable semiconductor device can be provided.

In this embodiment, the manufacturing process of the display device using a transistor is described; it is apparent that the method disclosed in this embodiment can be applied not only to a display device but also an electronic device of another embodiment (e.g., an integrated circuit).

(Embodiment 2)

In this embodiment, an example in which a display device including a transistor having a different structure from the transistor described in Embodiment 1 is manufactured will be described. FIGS. 2A to 2F are cross-sectional views illustrating a manufacturing process of the display device of this embodiment. The transistor described in this embodiment includes a semi-conductive oxide as a semiconductor and is a bottom-gate transistor. In addition, the transistor described in this embodiment is a bottom-contact transistor whose source electrode and drain electrode are in contact with a lower surface of a semiconductor layer.

Figure 2A:
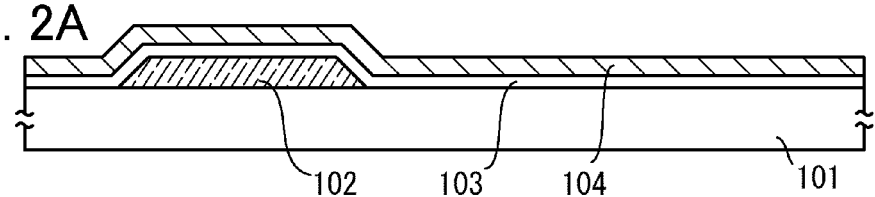
FIGS. 2A to 2F are cross-sectional views of a manufacturing process according to Embodiment 2.

The outline of a manufacturing process will be described below. Note that for the structures denoted by the same reference numerals as those in Embodiment 1, a material, a means, a condition, and the like described in Embodiment 1 may be used as those in this embodiment unless otherwise specified. As illustrated in FIG. 2A, the gate electrode 102, the first gate insulator 103, and the oxide film 104 are formed over the substrate 101 having an insulating surface.

The thickness of the first gate insulator 103 needs to be determined in accordance with the composition and thickness of the oxide film 104 for the same reason described in Embodiment 1. The first gate insulator 103 is not necessarily provided. The oxide film 104 is an oxide of gallium and zinc in this embodiment, and the ratio of gallium, that is, Ga/(Ga+Zn), may be greater than or equal to 0.2 and less than 0.8, preferably greater than or equal to 0.3 and less than 0.7.

Figure 2B:
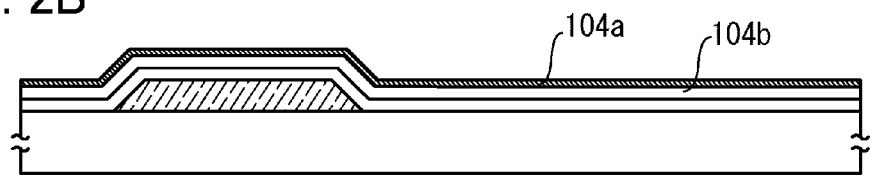

Next, the substrate 101 provided with these is heated at 400° C. to 700° C. for 10 minutes to 24 hours under an appropriate atmosphere, for example, under the condition that the pressure is 10 Pa to 1 normal atmospheric pressure and an atmosphere is any of an oxygen atmosphere, a nitrogen atmosphere, and a mixed atmosphere of oxygen and nitrogen. Then, the quality of the oxide film 104 is changed as illustrated in FIG. 2B, and the crystalline semi-conductive oxide layer 104a having high concentration of zinc is formed in the vicinity of a surface of the oxide film 104, and another portion becomes the insulating oxide layer 104b having low concentration of zinc. The ratio of gallium, that is, Ga/(Ga+Zn), may be greater than or equal to 0.7, preferably greater than or equal to 0.8 in the insulating oxide layer 104b.

Figure 2C:
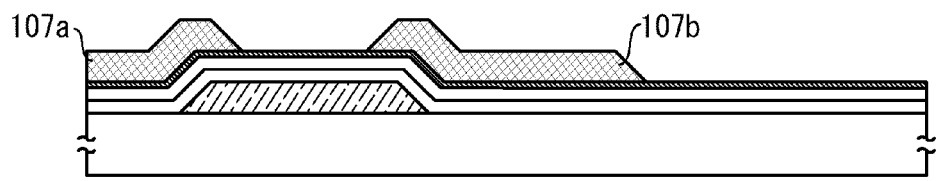
Figure 2D:
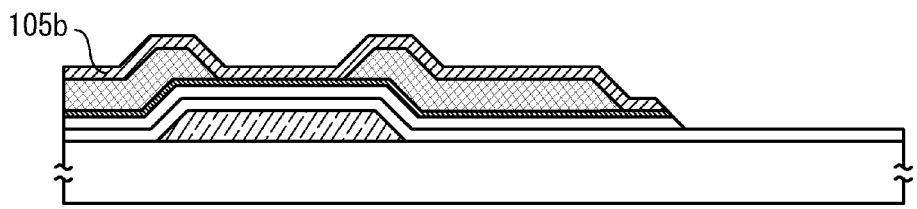

After that, a conductive film such as a metal film is deposited and processed to have a desired shape, so that the source electrode 107a and the drain electrode 107b are formed as illustrated in FIG. 2C. Further, the semi-conductive oxide film is formed thereover, and the semi-conductive oxide film and the insulating oxide layer 104b are etched, whereby the semi-conductive oxide film 105b having a desired shape (e.g., island shape) is obtained as illustrated in FIG. 2D. In the etching, a dry etching method or a wet etching method may be used.

Figure 2E:
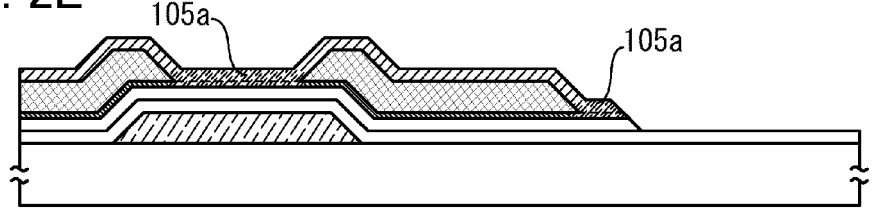

Further, the first heat treatment described in Embodiment 1 is performed, and in particular, the semi-conductive oxide film 105b in a portion in contact with the semi-conductive oxide layer 104a is made to be crystallized, whereby the semi-conductive oxide film 105a is obtained (see FIG. 2E).

Figure 2F:
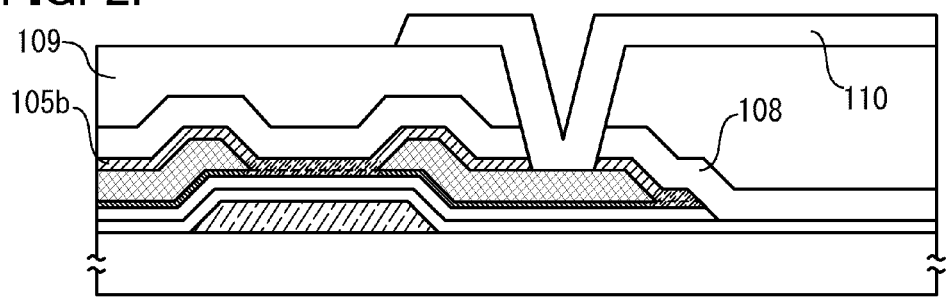

Further, the first insulator 108 is formed. After the first insulator 108 is formed, the second heat treatment may be performed. Next, the second insulator 109 which has a flat surface is formed. Then, the first insulator 108 and the second insulator 109 are selectively etched, so that a contact hole reaching the drain electrode 107b is formed. The display electrode 110 which is in contact with the drain electrode 107b through this contact hole is formed (FIG. 2F).

The difference between the transistor described in this embodiment and that described in Embodiment 1 is only positional relation between the semi-conductive oxide film 105, and the source electrode 107a and the drain electrode 107b. Therefore, the structure of the transistor seen from the above is almost the same as the structure illustrated in FIG. 6C.

Also in this embodiment, the insulating oxide layer 104b in which gallium is a main metal element is used. When such a material is in contact with a semi-conductive oxide in which, in particular, the ratio of gallium in a metal element is greater than or equal to 0.2, charge trapping at an interface between the insulating oxide layer 104b and a semi-conductive oxide film can be sufficiently suppressed. Accordingly, a highly reliable semiconductor device can be provided.

In this embodiment, the manufacturing process of the display device using a transistor is described; it is apparent that the method disclosed in this embodiment can be applied not only to a display device but also an electronic device of another embodiment (e.g., an integrated circuit).

(Embodiment 3)

In this embodiment, an example in which a display device including a transistor having a different structure from the transistors described in the above embodiments is manufactured will be described. FIGS. 3A to 3F are cross-sectional views illustrating a manufacturing process of the display device of this embodiment. The transistor described in this embodiment includes a semi-conductive oxide as a semiconductor and is a top-gate transistor in which a gate is formed over a semiconductor layer. In addition, the transistor described in this embodiment is a top-contact transistor whose source electrode and drain electrode are in contact with an upper surface of a semiconductor layer.

Figure 3A:
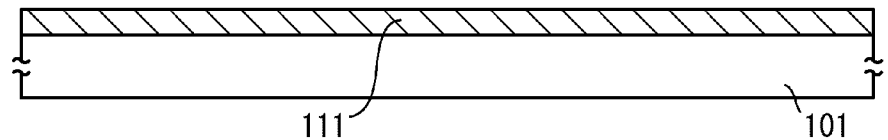
FIGS. 3A to 3F are cross-sectional views of a manufacturing process according to Embodiment 3.

The outline of a manufacturing process will be described below. Note that for the structures denoted by the same reference numerals as those in Embodiment 1, a material, a means, a condition, and the like described in Embodiment 1 may be used as those in this embodiment unless otherwise specified. As illustrated in FIG. 3A, an oxide film 111 is formed over the substrate 101. Note that since the oxide film 111 becomes an insulating oxide through a step such as heat treatment performed later, the surface of the substrate 101 may have conductivity.

Further, in the case where unfavorable impurities for a transistor are included in a substrate, it is preferable that a film of an insulating material having a function of blocking the impurities (e.g., aluminum nitride, aluminum oxide, or silicon nitride) be provided between the substrate 101 and the oxide film 111. Note that depending on the kind of the oxide film 111, the oxide film 111 can have a similar function in heat treatment performed later.

The oxide film 111 is an oxide of gallium and zinc in this embodiment, and the ratio of gallium, that is, Ga/(Ga+Zn), may be greater than or equal to 0.2 and less than 0.8, preferably greater than or equal to 0.3 and less than 0.7. The oxide film 111 is formed by a DC sputtering method or a pulsed DC sputtering method. The oxide film 111 can be formed in a manner similar to that of the oxide film 104 in Embodiment 1.

Figure 3B:
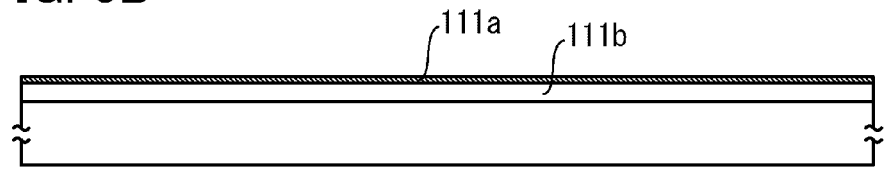

Next, the substrate 101 is heated at 400° C. to 700° C. for 10 minutes to 24 hours under an appropriate atmosphere, for example, under the condition that the pressure is 10 Pa to 1 normal atmospheric pressure and an atmosphere is any of an oxygen atmosphere, a nitrogen atmosphere, and a mixed atmosphere of oxygen and nitrogen. Then, the quality of the oxide film 111 is changed as illustrated in FIG. 3B, and a crystalline semi-conductive oxide layer 111a having high concentration of zinc is formed in the vicinity of a surface of the oxide film 111, and another portion becomes an insulating oxide layer 111b having low concentration of zinc. The ratio of gallium, that is, Ga/(Ga+Zn), may be greater than or equal to 0.7, preferably greater than or equal to 0.8 in the insulating oxide layer 111b.

In this embodiment, the insulating oxide layer 111b in which gallium is a main metal element is represented by the chemical formula: $Ga_xZn_{1-x}O_y$ (note that X≥0.7); however, it is preferable that oxygen exceed the stoichiometric ratio so as to satisfy $x/2+1<y<x/2+1.5$.

In this embodiment, since the insulating oxide layer 111b is an oxide in which gallium is a main metal element, the insulating oxide layer 111b has a function of blocking hydrogen and an alkali metal.

Figure 3C:
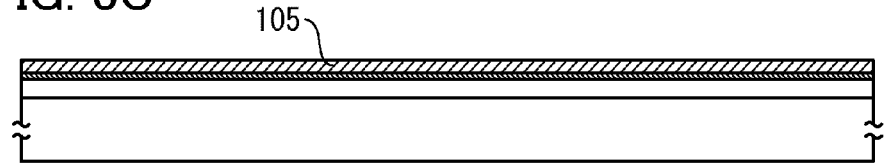
Figure 3D:
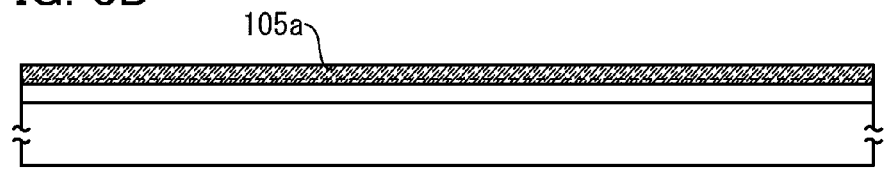

After that, the semi-conductive oxide film 105 is formed over the semi-conductive oxide layer 111a as illustrated in FIG. 3C. For the formation condition and the like of the semi-conductive oxide film 105, refer to Embodiment 1. Further, the semi-conductive oxide film 105 is crystallized by performing the first heat treatment described in Embodiment 1, whereby the semi-conductive oxide film 105a is obtained (see FIG. 3D).

Then, the semi-conductive oxide film 105 is etched, whereby the semi-conductive oxide film 105b having a desired shape (e.g., island shape) is obtained. In the etching, a dry etching method or a wet etching method may be used. Note that as the etching here, the insulating oxide layer 111b may be used as an etching stopper. After that, the plasma treatment described in Embodiment 1 may be performed.

Figure 3E:
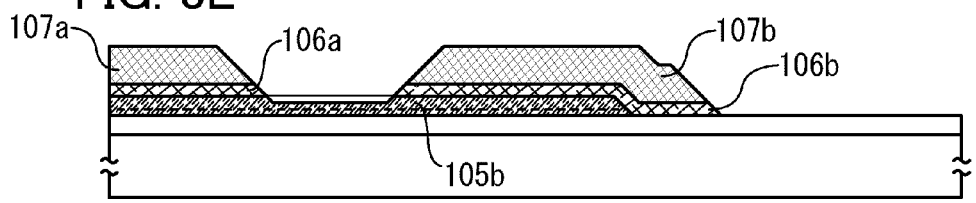
Figure 3F:
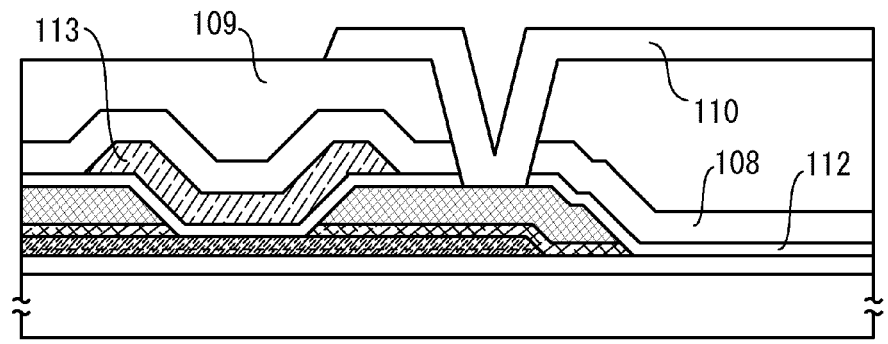

After that, a semi-conductive oxide film having n-type conductivity and a conductive film such as a metal film are deposited and each processed to have a desired shape, so that the N-type semi-conductive oxide films 106a and 106b, the source electrode 107a, and the drain electrode 107b are formed (see FIG. 3E). Note that the N-type semi-conductive oxide films 106a and 106b are not necessarily provided.

Further, a gate insulator 112 is deposited. For a formation method of the gate insulator 112, refer to the formation method of the first gate insulator 103 in Embodiment 1. The thickness of the gate insulator 112 may be set to a thickness which a transistor to be formed needs.

A gate electrode 113 is formed over the gate insulator 112. The gate electrode 113 can be a single layer or a stacked layer using a metal element such as molybdenum, titanium, chromium, tantalum, tungsten, aluminum, or copper, or an alloy material which includes any of these elements as a main component. Because the threshold value or the like of the obtained transistor is changed by a work function of a material used for the gate electrode 113, selection of a material in accordance with the required threshold is needed. In the above manner, a basic structure of a transistor is completed.

Further, the first insulator 108 is formed by a sputtering method, a CVD method, or the like. After the first insulator 108 is formed, the second heat treatment may be performed.

Next, the second insulator 109 which has a flat surface is formed. Then, the first insulator 108 and the second insulator 109 are selectively etched, so that a contact hole reaching the drain electrode 107b is formed. The display electrode 110 which is in contact with the drain electrode 107b through this contact hole is formed (see FIG. 3F).

The large difference between the transistor described in this embodiment and that described in Embodiment 1 is positional relation between the semi-conductive oxide film 105 and the gate electrode 113. However, the position of the gate electrode 102 in a substrate surface in FIG. 1F is almost the same as that of the gate electrode 113 in FIG. 3F. Therefore, the structure of the transistor seen from the above is almost the same as the structure illustrated in FIG. 6C.

Also in this embodiment, the insulating oxide layer 111b in which gallium is a main metal element is used. When such a material is in contact with a semi-conductive oxide film in which, in particular, the ratio of gallium in a metal element is greater than or equal to 0.2, charge trapping at an interface between the insulating oxide layer 111b and the semi-conductive oxide film can be sufficiently suppressed. Accordingly, a highly reliable semiconductor device can be provided.

In this embodiment, the manufacturing process of the display device using a transistor is described; it is apparent that the method disclosed in this embodiment can be applied not only to a display device but also an electronic device of another embodiment (e.g., an integrated circuit).

(Embodiment 4)

In this embodiment, an example in which a display device including a top-gate transistor like the transistor described in Embodiment 3 is manufactured is described; however the transistor in this embodiment is a bottom-contact transistor whose source electrode and drain electrode are in contact with a lower surface of a semiconductor layer. FIGS. 4A to 4F are cross-sectional views illustrating a manufacturing process of the display device of this embodiment.

Figure 4A:
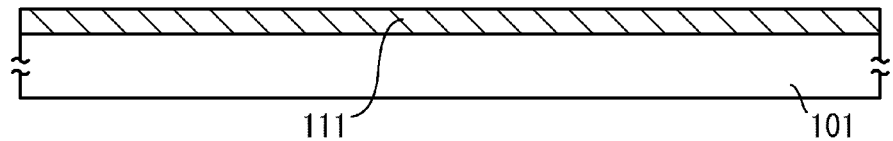
FIGS. 4A to 4F are cross-sectional views of a manufacturing process according to Embodiment 4.

The outline of a manufacturing process will be described below. Note that for the structures denoted by the same reference numerals as those in Embodiment 1 or 3, those described in Embodiment 1 or 3 may be used unless otherwise specified. As illustrated in FIG. 4A, the oxide film 111 is formed over the substrate 101. The surface of the substrate 101 may have conductivity as in Embodiment 3.

The oxide film 111 is an oxide of gallium and zinc in this embodiment, and the ratio of gallium, that is, Ga/(Ga+Zn), may be greater than or equal to 0.2 and less than 0.8, preferably greater than or equal to 0.3 and less than 0.7. The thickness of the oxide film 111 may be more than or equal to 100 nm and less than or equal to 1000 nm.

Figure 4B:
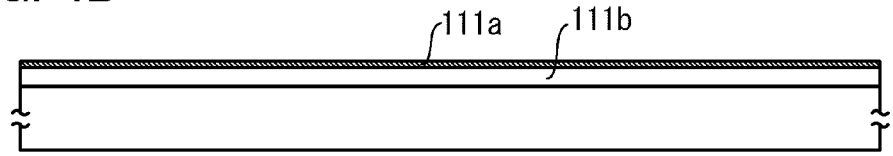
Figure 4C:
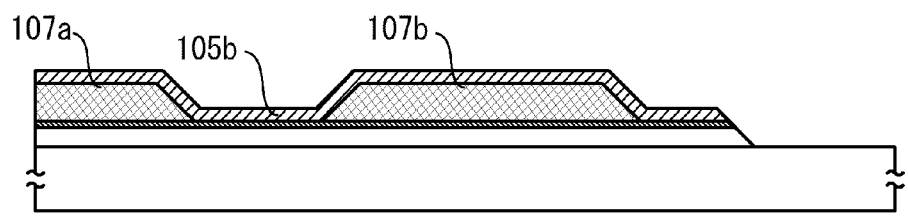

Next, the substrate 101 is heated at 400° C. to 700° C. for 10 minutes to 24 hours under an appropriate atmosphere, for example, under the condition that the pressure is 10 Pa to 1 normal atmospheric pressure and an atmosphere is any of an oxygen atmosphere, a nitrogen atmosphere, and a mixed atmosphere of oxygen and nitrogen. Then, the quality of the oxide film 111 is changed as illustrated in FIG. 4B, and the crystalline semi-conductive oxide layer 111a having high concentration of zinc is formed in the vicinity of a surface of the oxide film 111, and another portion becomes the insulating oxide layer 111b having low concentration of zinc. The ratio of gallium, that is, Ga/(Ga+Zn), may be greater than or equal to 0.7, preferably greater than or equal to 0.8 in the insulating oxide layer 111b.

After that, a conductive film such as a metal film is deposited and processed to have a desired shape, so that the source electrode 107a and the drain electrode 107b are formed. Then, a semi-conductive oxide film is formed over the source electrode 107a and the drain electrode 107b and etched, whereby the semi-conductive oxide film 105b having a desired shape (e.g., island shape) is obtained (see FIG. 4C).

Figure 4D:
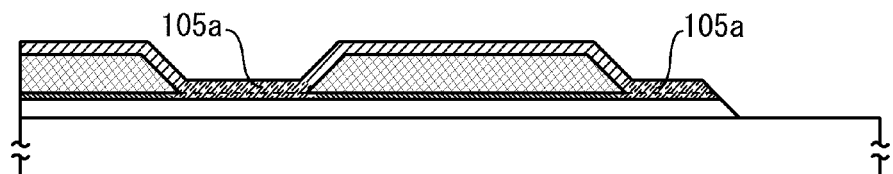
Figure 4E:
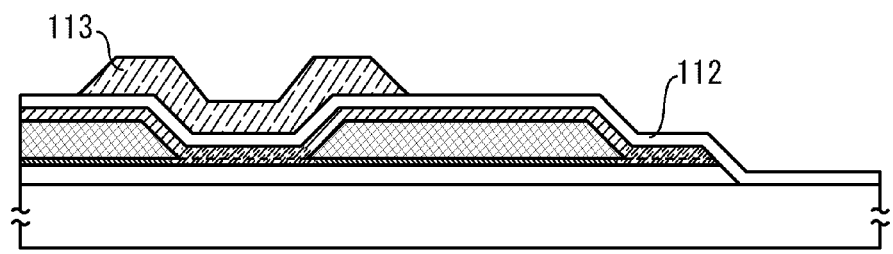
Figure 4F:
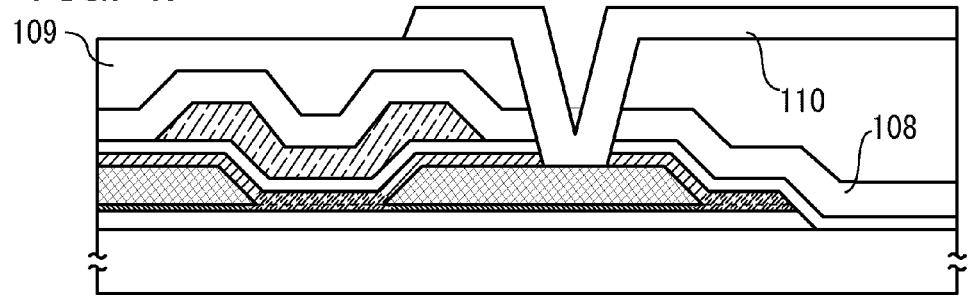

Further, the first heat treatment described in Embodiment 1 is performed, and in particular, the semi-conductive oxide film 105b in a portion in contact with the semi-conductive oxide layer 104a is made to be crystallized, whereby the semi-conductive oxide film 105a is obtained (see FIG. 4D). In addition, as illustrated in FIG. 4E, the gate insulator 112 is deposited and the gate electrode 113 is formed over the gate insulator 112.

Further, the first insulator 108 is formed by a sputtering method, a CVD method, or the like and the second insulator 109 which has a flat surface is formed thereover. Then, the first insulator 108 and the second insulator 109 are selectively etched, so that a contact hole reaching the drain electrode 107b is formed. The display electrode 110 which is in contact with the drain electrode 107b through this contact hole is formed (see FIG. 4F).

In this embodiment, the manufacturing process of the display device using a transistor is described; it is apparent that the method disclosed in this embodiment can be applied not only to a display device but also an electronic device of another embodiment (e.g., an integrated circuit).
(Embodiment 5)

Figure 5A:
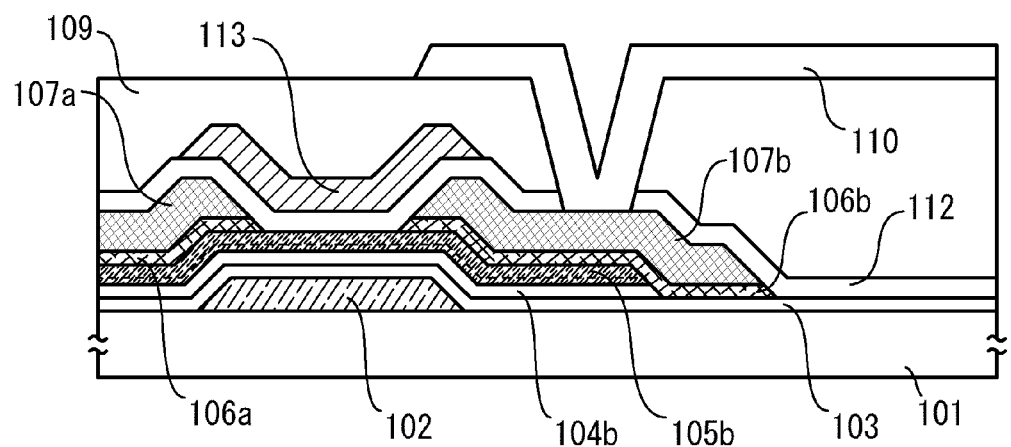
FIGS. 5A and 5B are cross-sectional views according to Embodiments 5 and 6.

In this embodiment, an example of a display device having a transistor which is different from the transistor described in any of the above embodiments will be described. A transistor illustrated in FIG. 5A is one of dual-gate transistors including two gate electrodes above and below a semiconductor layer.

The transistor includes, over the substrate 101 having an insulating surface, the first gate electrode 102, the first gate insulator 103, the insulating oxide layer 104b which includes gallium as a main metal element, the semi-conductive oxide film 105b, the N-type semi-conductive oxide films 106a and 106b, the source electrode 107a, the drain electrode 107b, the second gate insulator 112, and the second gate electrode 113. Further, the display device described in this embodiment includes the insulator 109 having a flat surface, and the display electrode 110 connected to the drain electrode 107b through a contact hole which penetrates the insulator 109 and the second gate insulator 112 and which reaches the drain electrode 107b.

In the above structure, for materials, manufacturing methods, and the like of the second gate insulator 112 and the second gate electrode 113, refer to those of the gate insulator 112 and the gate electrode 113 of Embodiment 3 or 4. For the other components, refer to the contents described in Embodiment 1.

When a semi-conductive oxide layer is used for a semiconductor layer in a transistor, the threshold voltage of the transistor sometimes shifts in the positive or negative direction depending on a manufacturing process of a semiconductor device in some cases. Therefore, like the above-described transistor, a dual-gate transistor in which the second gate electrode 113 is provided over the second gate insulator 112 so that the threshold voltage can be controlled is preferably used. The potential of the first gate electrode 102 or the potential of the second gate electrode 113 is controlled, whereby the threshold voltage can be made to be an appropriate level.

Further, the first gate electrode 102 and the second gate electrode 113 can block light irradiation from the outside; thus, variation in the electrical characteristics of the transistor due to light irradiation performed on the semi-conductive oxide film 105b can be suppressed.

In this embodiment, the manufacturing process of the display device using a transistor is described; it is apparent that the method disclosed in this embodiment can be applied not only to a display device but also an electronic device of another embodiment (e.g., an integrated circuit).
(Embodiment 6)

Figure 5B:
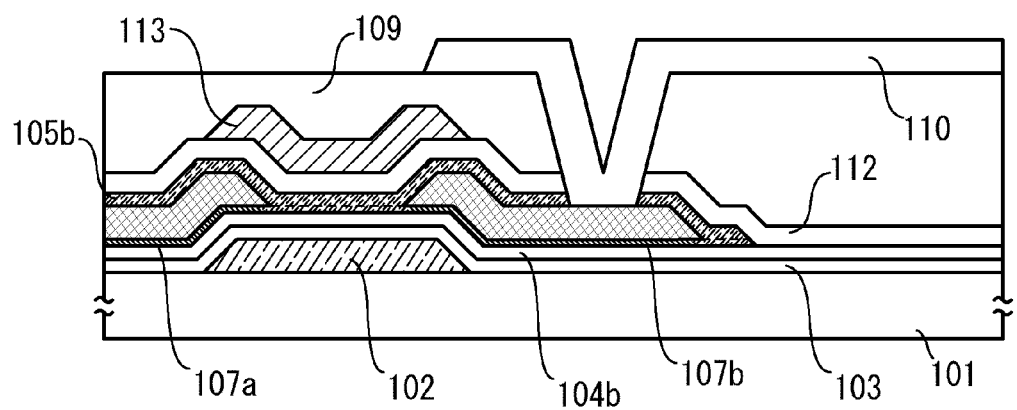

In this embodiment, an example of a display device having a dual-gate transistor which is different from the dual-gate transistor described in Embodiment 5 is illustrated in FIG. 5B. This display device includes, over the substrate 101 having an insulating surface, the first gate electrode 102, the first gate insulator 103, the insulating oxide layer 104b which includes gallium as a main metal element, the source electrode 107a, the drain electrode 107b, the semi-conductive oxide film 105b, the second gate insulator 112, and the second gate electrode 113.

Further, the display device described in this embodiment includes the insulator 109 having a flat surface, and the display electrode 110 connected to the drain electrode 107b through a contact hole which penetrates the insulator 109 and the second gate insulator 112 and which reaches the drain electrode 107b.

In the above structure, for materials, manufacturing methods, and the like of the second gate insulator 112 and the second gate electrode 113, refer to those of the gate insulator 112 and the gate electrode 113 of Embodiment 3 or 4. For the other components, refer to the contents described in Embodiment 1 or 2. The display device illustrated in FIG. 5B differs from that in FIG. 5A in the positional relation between the semi-conductive oxide film 105b, and the source electrode 107a and the drain electrode 107b.
(Embodiment 7)

The display device disclosed in any of Embodiments 1 to 6 can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

In addition, a transistor having the structure disclosed in any of Embodiments 1 to 6 can be used for, other than a display device, various integrated circuits (including a memory device), an electronic device which incorporate the integrated circuits, an electric appliance which incorporate the integrated circuits, and the like, for example.

This application is based on Japanese Patent Application serial no. 2010-187878 filed with Japan Patent Office on Aug. 25, 2010, the entire contents of which are hereby incorporated by reference.

What is claimed is:

1. A manufacturing method of a semiconductor device, comprising the steps of:
    forming a first film that contains Ga, Zn and O, over a substrate while a temperature of the substrate in film formation is set to higher than or equal to 100° C. and lower than or equal to 600° C.; and
    forming a second film that is in contact with the first film,
    wherein a ratio of Ga/(Ga+Zn) of the first film is greater than or equal to 0.2 and less than 0.8, and
    wherein the second film comprises crystalline In—Ga—Zn-based oxide semiconductor.

2. The manufacturing method of a semiconductor device, according to claim 1, further comprising the step of heating the first film to form a first layer that contains a crystal of an oxide including a first metal element as a main metal component and a second layer that is on a side closer to the substrate than the first layer and contains an oxide including a second metal element as a main metal component before the step of forming the second film.

3. The manufacturing method of a semiconductor device, according to claim 1, wherein a concentration of sodium in at least one of the first film and the second film is lower than $5 \times 10^{16}$ cm$^{-3}$.

4. The manufacturing method of a semiconductor device, according to claim 1, further comprising the step of heating the first film and the second film.

5. The manufacturing method of a semiconductor device, according to claim 1, wherein the first film and the second film comprise semi-conductive oxide.

6. The manufacturing method of a semiconductor device, according to claim 2, wherein a ratio of the second metal element to a metal element in the second film is greater than or equal to 0.2.

7. The manufacturing method of a semiconductor device, according to claim 1, wherein the first film is formed by a DC sputtering method.

8. A manufacturing method of a semiconductor device, comprising the steps of:
forming a first film that contains Ga, Zn and O, over a substrate while a temperature of the substrate in film formation is set to higher than or equal to 100° C. and lower than or equal to 600° C.;
heating the first film, and
forming a second film that is in contact with the first film,
wherein a ratio of Ga/(Ga+Zn) of the first film is greater than or equal to 0.2 and less than 0.8, and
wherein the second film comprises crystalline In—Ga—Zn-based oxide semiconductor.

9. The manufacturing method of a semiconductor device, according to claim 8, wherein the step of heating the first film is performed to form a first layer that contains a crystal of an oxide including a first metal element as a main metal component and a second layer that is on a side closer to the substrate than the first layer and contains an oxide including a second metal element as a main metal component.

10. The manufacturing method of a semiconductor device, according to claim 8, wherein a concentration of sodium in at least one of the first film and the second film is lower than $5 \times 10^{16}$ cm$^{-3}$.

11. The manufacturing method of a semiconductor device, according to claim 8, further comprising the step of heating the first film and the second film.

12. The manufacturing method of a semiconductor device, according to claim 8, wherein the first film and the second film comprise semi-conductive oxide.

13. The manufacturing method of a semiconductor device, according to claim 9, wherein a ratio of the second metal element to a metal element in the second film is greater than or equal to 0.2.

14. The manufacturing method of a semiconductor device, according to claim 8, wherein the first film is formed by a DC sputtering method.

15. A manufacturing method of a semiconductor device, comprising the steps of:
forming a first film that contains Ga, Zn and O, over a substrate; and
forming a second film that is in contact with the first film,
wherein a ratio of Ga/(Ga+Zn) of the first film is greater than or equal to 0.2 and less than 0.8, and
wherein the second film contains In, Ga, Zn and O.

16. The manufacturing method of a semiconductor device, according to claim 15, further comprising the step of heating the first film to form a first layer that contains a crystal of an oxide including a first metal element as a main metal component and a second layer that is on a side closer to the substrate than the first layer and contains an oxide including a second metal element as a main metal component before the step of forming the second film.

17. The manufacturing method of a semiconductor device, according to claim 15, wherein a concentration of sodium in at least one of the first film and the second film is lower than $5 \times 10^{16}$ cm$^{-3}$.

18. The manufacturing method of a semiconductor device, according to claim 15, further comprising the step of heating the first film and the second film.

19. The manufacturing method of a semiconductor device, according to claim 15, wherein the first film and the second film comprise semi-conductive oxide.

20. The manufacturing method of a semiconductor device, according to claim 16, wherein a ratio of the second metal element to a metal element in the second film is greater than or equal to 0.2.

21. The manufacturing method of a semiconductor device, according to claim 15, wherein the first film is formed by a DC sputtering method.

* * * * *